United States Patent
Cha et al.

(10) Patent No.: US 8,928,415 B2
(45) Date of Patent: Jan. 6, 2015

(54) ADJUSTABLE GAIN FOR MULTI-STACKED AMPLIFIERS

(71) Applicant: QUALCOMM Incorporated, San Diego, CA (US)

(72) Inventors: Jeongwon Cha, San Diego, CA (US); Chang-Ho Lee, San Diego, CA (US); Aristotele Hadjichristos, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 77 days.

(21) Appl. No.: 13/678,923

(22) Filed: Nov. 16, 2012

(65) Prior Publication Data
US 2014/0139288 A1   May 22, 2014

(51) Int. Cl.
| | |
|---|---|
| *H03F 1/22* | (2006.01) |
| *H03F 1/02* | (2006.01) |
| *H03F 1/52* | (2006.01) |
| *H03F 3/21* | (2006.01) |
| *H03K 17/10* | (2006.01) |
| *H03F 3/24* | (2006.01) |

(52) U.S. Cl.
CPC .............. *H03F 1/0277* (2013.01); *H03F 1/223* (2013.01); *H03F 1/523* (2013.01); *H03F 3/211* (2013.01); *H03K 17/102* (2013.01); *H03F 3/245* (2013.01); *H03F 2200/61* (2013.01)
USPC ....................................................... 330/311

(58) Field of Classification Search
USPC ........................................... 330/311, 51, 298
See application file for complete search history.

(56) References Cited

U.S. PATENT DOCUMENTS

| | | | |
|---|---|---|---|
| 7,352,247 B2 | 4/2008 | Oh et al. | |
| 7,489,202 B1 | 2/2009 | Griffiths et al. | |
| 7,589,593 B2 | 9/2009 | Lai et al. | |
| 7,737,790 B1 | 6/2010 | Chen et al. | |
| 7,821,339 B1 | 10/2010 | Afsahi | |
| 8,022,772 B2 | 9/2011 | Cassia et al. | |
| 8,648,656 B2 * | 2/2014 | Nozaki et al. | ............ 330/51 |
| 2005/0077965 A1 | 4/2005 | Li | |
| 2010/0141337 A1 | 6/2010 | Chen | |

OTHER PUBLICATIONS

Kim, et al., "A Linear Multi-Mode CMOS Power Amplifier With Discrete Resizing and Concurrent Power Combining Structure," IEEE Journal of Solid-State Circuits, vol. 46, No. 5, pp. 1034-1048, May 2011.
Partial International Search Report—PCT/US2013/070434—ISA/EPO—Feb. 6, 2014.
International Search Report and Written Opinion—PCT/US2013/070434—ISA/EPO—May 9, 2014.

* cited by examiner

*Primary Examiner* — Steven J Mottola
(74) *Attorney, Agent, or Firm* — Ramin Mobarhan

(57) ABSTRACT

Techniques for providing adjustable gain in an amplifier. In an aspect, a composite amplifier having adjustable gain includes a plurality of amplifiers coupled in parallel, wherein each of the amplifiers may be turned on or off to adjust the overall gain of the composite amplifier. Each amplifier may include an input transistor and at least two cascode transistors. To turn each amplifier off, the gate voltage of a second or lowermost cascode transistor coupled to the input transistor may be grounded, and the gate voltage of a first cascode transistor coupled to the output voltage may be coupled to a first turn-off voltage to reduce the drain-to-gate voltage drop across the first cascode transistor. Further aspects provide for decoupling a capacitor coupled to the gates of the cascode transistors from AC ground when the amplifier is turned off.

19 Claims, 11 Drawing Sheets

ADJUSTABLE GAIN FOR MULTI-STACKED AMPLIFIERS

BACKGROUND

1. Field

The disclosure relates to techniques for providing amplifiers with adjustable gain.

2. Background

Amplifiers with adjustable gain are commonly utilized in many types of circuitry, e.g., in wireless transceivers including a power amplifier for amplifying a signal for transmission over a wireless medium. To provide adjustable gain, a composite amplifier may be implemented using a plurality of individual amplifiers coupled in parallel, wherein each of the plurality of amplifiers may be turned on or off to vary the effective size of the composite amplifier. A common amplifier topology is a multi-stacked cascode circuit, in which an input transistor is coupled to at least two cascode transistors. To turn off an amplifier adopting a multi-stacked cascode circuit topology, the gate bias voltages of the cascode transistors may be grounded to turn off the DC bias current through the amplifier.

A disadvantage of grounding the gate bias voltages in this manner is that, while the selected amplifier may be effectively turned off, large voltage drops may still appear across the terminals of the turned-off cascode transistors. This is due to the operation of the other amplifiers in the composite amplifier that are still turned on, and which may still the drive the output node. In certain cases, the large voltage drops may exceed the breakdown limits of the turned-off devices, thereby undesirably increasing the failure rate and/or cost of the composite amplifier circuit.

It would be desirable to provide improved techniques for adjusting the gain of an amplifier.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The detailed description set forth below in connection with the appended drawings is intended as a description of exemplary aspects of the invention and is not intended to represent the only exemplary aspects in which the invention can be practiced. The term "exemplary" used throughout this description means "serving as an example, instance, or illustration," and should not necessarily be construed as preferred or advantageous over other exemplary aspects. The detailed description includes specific details for the purpose of providing a thorough understanding of the exemplary aspects of the invention. It will be apparent to those skilled in the art that the exemplary aspects of the invention may be practiced without these specific details. In some instances, well-known structures and devices are shown in block diagram form in order to avoid obscuring the novelty of the exemplary aspects presented herein. In this specification and in the claims, the terms "module" and "block" may be used interchangeably to denote an entity configured to perform the operations described.

Figure 1:
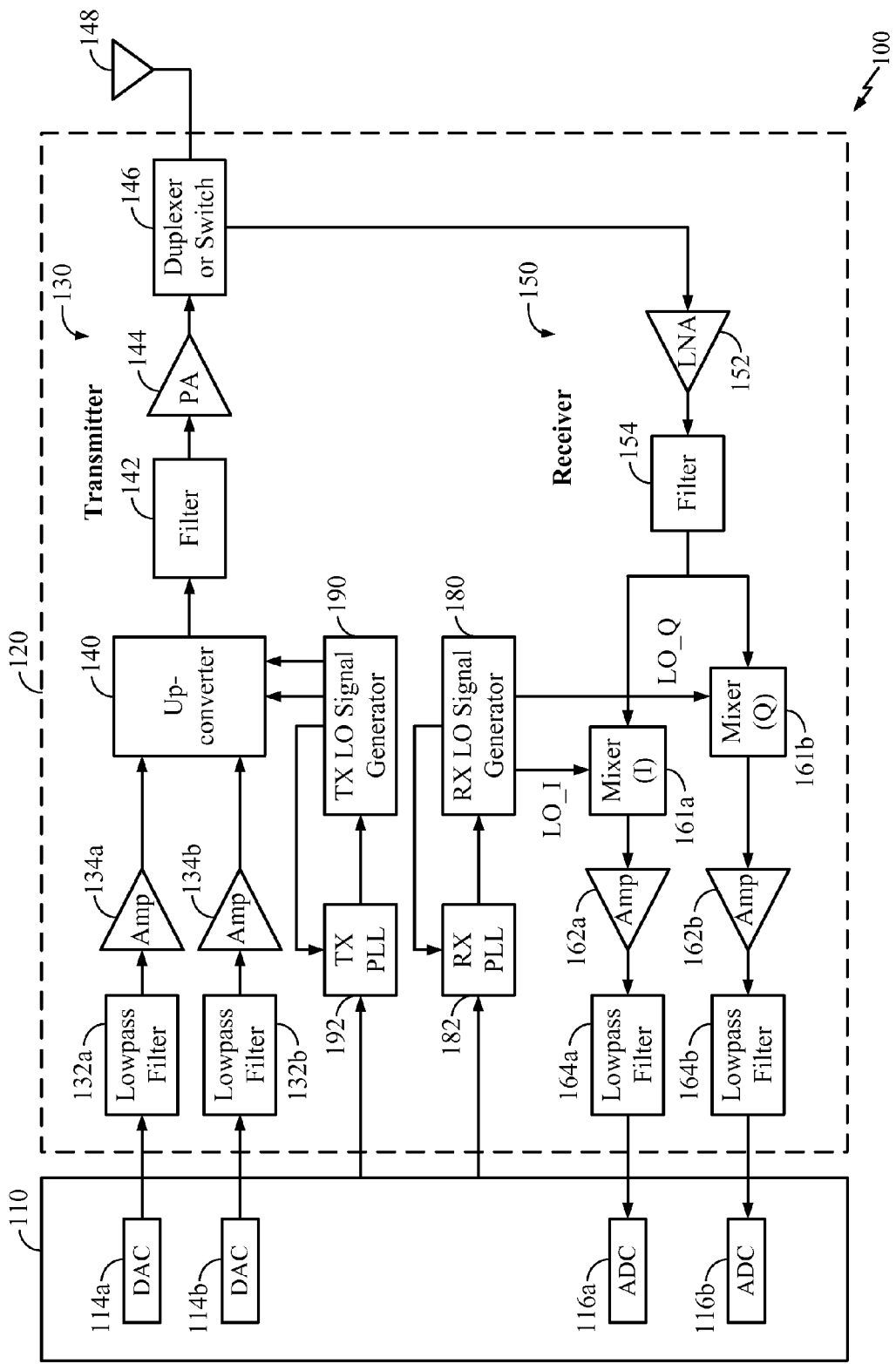
FIG. 1 illustrates a block diagram of a design of a wireless communication device in which the techniques of the present disclosure may be implemented.

FIG. 1 illustrates a block diagram of a design of a wireless communication device 100 in which the techniques of the present disclosure may be implemented. FIG. 1 shows an example transceiver design. In general, the conditioning of the signals in a transmitter and a receiver may be performed by one or more stages of amplifier, filter, upconverter, downconverter, etc. These circuit blocks may be arranged differently from the configuration shown in FIG. 1. Furthermore, other circuit blocks not shown in FIG. 1 may also be used to condition the signals in the transmitter and receiver. Unless otherwise noted, any signal in FIG. 1, or any other figure in the drawings, may be either single-ended or differential. Some circuit blocks in FIG. 1 may also be omitted.

In the design shown in FIG. 1, wireless device 100 includes a transceiver 120 and a data processor 110. The data processor 110 may include a memory (not shown) to store data and program codes. Transceiver 120 includes a transmitter 130 and a receiver 150 that support bi-directional communication. In general, wireless device 100 may include any number of transmitters and/or receivers for any number of communication systems and frequency bands. All or a portion of transceiver 120 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency-converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the design shown in FIG. 1, transmitter 130 and receiver 150 are implemented with the direct-conversion architecture.

In the transmit path, data processor 110 processes data to be transmitted and provides I and Q analog output signals to transmitter 130. In the exemplary embodiment shown, the data processor 110 includes digital-to-analog-converters (DAC's) 114a and 114b for converting digital signals generated by the data processor 110 into the I and Q analog output signals, e.g., I and Q output currents, for further processing.

Within transmitter 130, lowpass filters 132a and 132b filter the I and Q analog output signals, respectively, to remove undesired images caused by the prior digital-to-analog conversion. Amplifiers (Amp) 134a and 134b amplify the signals from lowpass filters 132a and 132b, respectively, and provide I and Q baseband signals. An upconverter 140 upconverts the I and Q baseband signals with I and Q transmit (TX) local oscillating (LO) signals from a TX LO signal generator 190 and provides an upconverted signal. A filter 142 filters the upconverted signal to remove undesired images caused by the frequency upconversion as well as noise in a receive frequency band. A power amplifier (PA) 144 amplifies the signal from filter 142 to obtain the desired output power level and provides a transmit RF signal. The transmit RF signal is routed through a duplexer or switch 146 and transmitted via an antenna 148.

In an exemplary embodiment, the PA 144 may be designed using the techniques of the present disclosure. For example, the PA 144 may be provided with adjustable gain, wherein bias voltages and/or one or more switchable capacitors in the PA 144 may be provided according to the techniques of the present disclosure. Note, however, that the techniques disclosed herein need not be restricted to implementation in a power amplifier such as shown in FIG. 1, and may generally be applied to design amplifiers in any system, e.g., audio amplifiers or other types of amplifiers. Such alternative exemplary embodiments are contemplated to be within the scope of the present disclosure.

In the receive path, antenna 148 receives signals transmitted by base stations and provides a received RF signal, which is routed through duplexer or switch 146 and provided to a low noise amplifier (LNA) 152. The received RF signal is amplified by LNA 152 and filtered by a filter 154 to obtain a desirable RF input signal. Downconversion mixers 161a and 161b mix the output of filter 154 with I and Q receive (RX) LO signals (i.e., LO_I and LO_Q) from an RX LO signal generator 180 to generate I and Q baseband signals. The I and Q baseband signals are amplified by amplifiers 162a and 162b and further filtered by lowpass filters 164a and 164b to obtain I and Q analog input signals, which are provided to data processor 110. In the exemplary embodiment shown, the data processor 110 includes analog-to-digital-converters (ADC's) 116a and 116b for converting the analog input signals into digital signals to be further processed by the data processor 110.

TX LO signal generator 190 generates the I and Q TX LO signals used for frequency upconversion. RX LO signal generator 180 generates the I and Q RX LO signals used for frequency downconversion. Each LO signal is a periodic signal with a particular fundamental frequency. A PLL 192 receives timing information from data processor 110 and generates a control signal used to adjust the frequency and/or phase of the TX LO signals from LO signal generator 190. Similarly, a PLL 182 receives timing information from data processor 110 and generates a control signal used to adjust the frequency and/or phase of the RX LO signals from LO signal generator 180.

Figure 2:
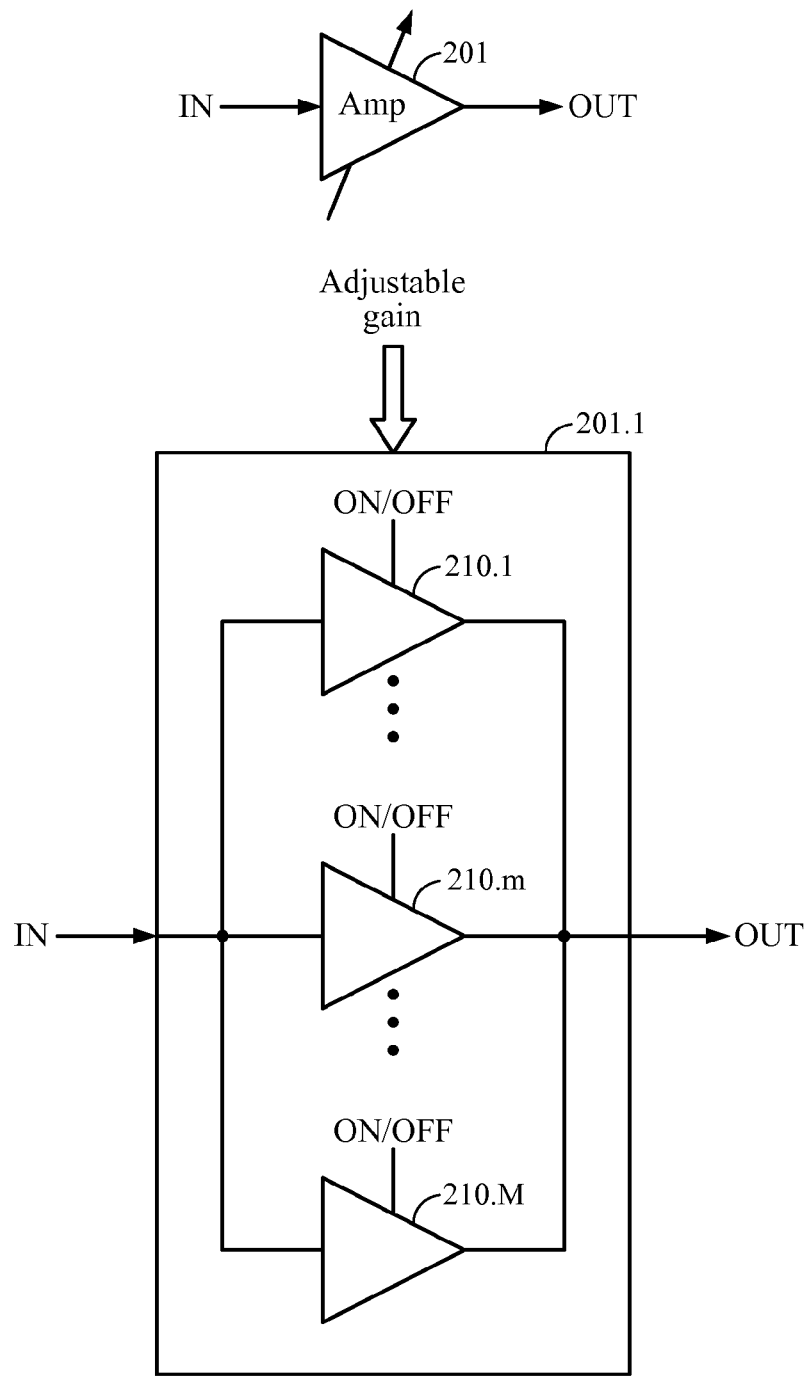
FIG. 2 illustrates a prior art implementation of an amplifier having adjustable gain.

FIG. 2 illustrates a prior art implementation 201 of an amplifier having adjustable gain. In FIG. 2, an amplifier 201 is provided for amplifying an input voltage IN to generate an output voltage OUT. In certain implementations, the amplifier 201 may be, e.g., a radio-frequency (RF) power amplifier (PA) configured to amplify a signal for transmission over a communications medium, as described, e.g., with reference to element 144 in FIG. 1. To optimize efficiency, the amplifier 201 may be provided in a plurality of gain modes, e.g., as may be required based on varying channel conditions. In particular, in a first or high gain mode, the amplifier 201 may provide a high level of gain to the input voltage IN to generate OUT, while in a second or low gain mode, the amplifier 201 may provide a low level of gain to IN.

As the high gain mode may require greater DC power consumption than the low gain mode, it is desirable to operate the amplifier 201 in high gain mode only when such high gain is required. Note two gain modes (e.g., "first" and "second") have been described for illustrative purposes only, and certain implementations of an amplifier having adjustable gain may incorporate an arbitrary number of gain modes, as further described hereinbelow.

FIG. 2 further illustrates an implementation 201.1 of a composite amplifier 201, wherein a plurality of gain modes may be selected by turning on or off respective parallel-coupled amplifiers 210.1 through 210.M. In particular, depending on the number of amplifiers 210.1 through 210.M enabled, the overall gain of the composite amplifier 201.1 may be adjusted. In this manner, adjustable gain for the amplifier 201.1 may be understood as being implemented using "adjustable size." In particular, enabling or disabling of the parallel-coupled amplifiers 210.1 through 210.M can be understood to effectively adjust the "size" of the composite amplifier 201.1, thereby adjusting the overall gain of the composite amplifier 201.1.

In this specification and in the claims, the term "composite amplifier" may denote an entity (such as 201.1) configured to amplify an input voltage to generate an output voltage with adjustable gain, while the term "amplifier" may denote an entity (such as any of 210.1 through 210.M), also configured to amplify and input voltage to generate an output voltage. In an exemplary embodiment, a composite amplifier may include a plurality of amplifiers coupled in parallel. Note 201.1 is shown for illustrative purposes only, and is not meant to limit the scope of the present disclosure to any particular implementation of the constituent amplifiers 210.1 through 210.M, nor is it meant to limit the scope of the present disclosure to any particular manner of coupling the constituent amplifiers to each other to produce the adjustable gain.

Figure 3:
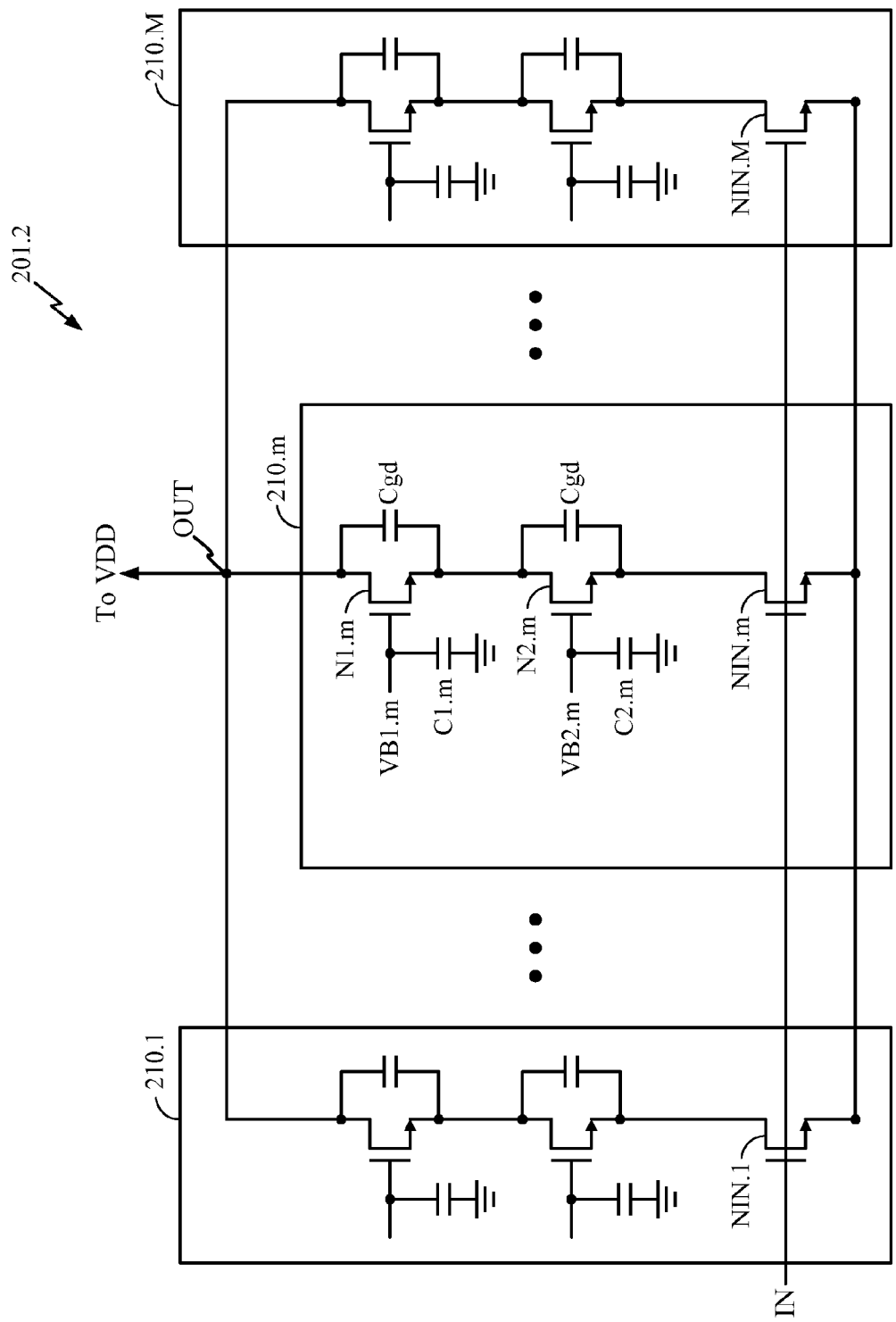
FIG. 3 illustrates a specific implementation of a plurality of parallel-coupled amplifiers combined to produce a composite amplifier having adjustable gain.

FIG. 3 illustrates a specific implementation of a plurality of parallel-coupled amplifiers 210.1 through 210.M combined to produce a composite amplifier 201.2 having adjustable gain. Note FIG. 3 is shown for illustrative purposes only, and is not meant to limit the scope of the present disclosure to any particular types of constituent amplifiers, e.g., two-cascode amplifiers.

In FIG. 3, each of parallel-coupled amplifiers 210.1 through 210.M adopts a multi-cascode circuit topology or configuration. Note the multi-cascode circuit topology may also be referred to herein as a "multi-stacked" amplifier topology. For example, amplifier 210.m, wherein m is an arbitrary index from 1 to M inclusive, includes an input transistor NIN.m, which is coupled to an input voltage IN of the adjustable gain amplifier 201.2. Transistors N1.m and N2.m are coupled to the drain of transistor NIN.m in a cascode configuration. In particular, transistor N1.m, also denoted a "first cascode transistor," has a drain coupled to the output voltage OUT and a source coupled to the drain of transistor N2.m, also denoted a "second cascode transistor." N2.m has a source coupled to the drain of NIN.m.

The gates of N1.m and N2.m are coupled to bias voltages VB1.m and VB2.m, respectively, wherein the bias voltages may be chosen to provide the appropriate gain characteristics for the multi-cascode amplifier 210.m. For example, in an implementation, VB1.m may be greater than VB2.m. Further coupled to the gates of N1.m and N2.m are AC coupling capacitors C1.m and C2.m, respectively, which couple the gates of the cascode transistors to AC ground. Note the elements of others of the multi-cascode amplifiers 210.1 through 210.M are not labeled in FIG. 3, but may perform similar functionality to the elements described with reference to amplifier 210.m.

In FIG. 3, it will be appreciated that to provide adjustable gain to the amplifier 201.2, a suitable plurality of the multi-cascode amplifiers 210.1 through 210.M may be turned on (or "enabled"), and the rest of the multi-cascode amplifiers may be simultaneously turned off (or "disabled"). In this manner, the composite amplifier 201.2 provides a gain to IN that increases with the number of amplifiers enabled.

Figure 4:
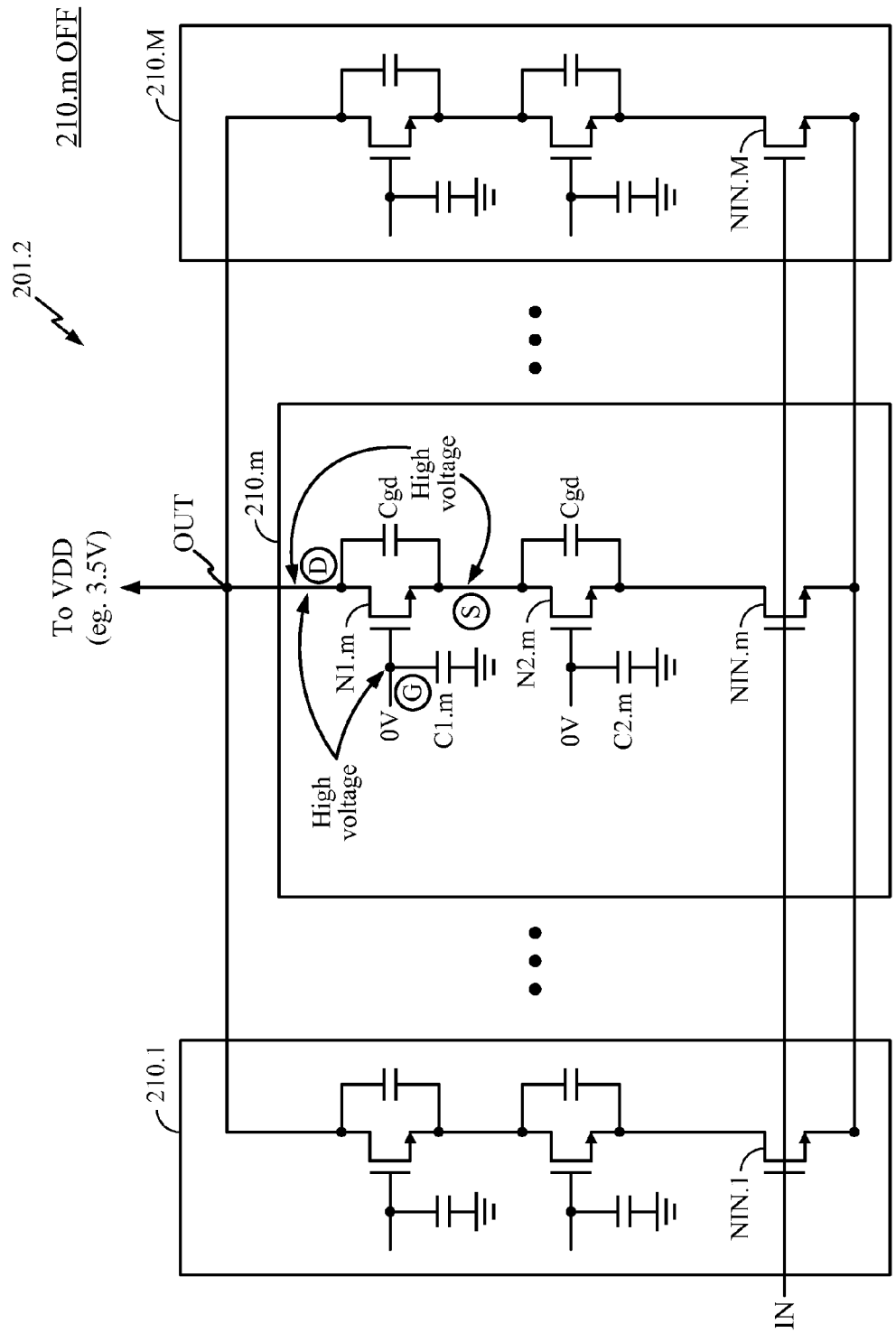
FIG. 4 shows an illustrative technique whereby one of the multi-cascode amplifiers is turned off, so that the composite amplifier may have adjustable gain.

FIG. 4 shows an illustrative technique whereby one of the multi-cascode amplifiers 210.m is turned off, so that the composite amplifier 201.2 may have adjustable gain. In particular, the gate voltages of both the first cascode transistor N1.m and the second cascode transistor N2.m are grounded (or coupled to 0 V, as shown in FIG. 4). It will be appreciated that this nominally turns off transistors N1.m and N2.m, and thus turns off the amplifier 210.m. Note while amplifier 210.m may be specifically turned off in this manner, any or all of the other amplifiers 210.1 through 210.m−1 (not labeled in FIG. 3) or amplifiers 210.m+1 (not labeled in FIG. 3) through 210.M may still be turned on.

It will be appreciated that certain problems may arise when the gate voltages of the first and second cascode transistors of 210.m are tied to ground in the manner described hereinabove. For example, assuming that other amplifiers (e.g., any of 210.1 through 210.m−1 and/or 210.m+1 through 210.M) are still active, a high voltage (e.g., close to the rail voltage VDD, equal to 3.5 V in the illustrative instance shown in FIG. 4) may still be present at the drain of N1.m. If OUT (which is also coupled to the drain of N1.m) is at a high voltage, then a large voltage difference may be present across the drain ("D") and gate ("G") of N1.m, as well as across its drain ("D") and source ("S"). A high voltage drop caused by OUT across N1.m may undesirably cause breakdown of a device, e.g., when such voltage drop exceeds the device specifications for maximum voltage drop allowed. For example, such situations may arise when a 0.18 um device is used with a 3.5V supply, or a 0.65 um device used with a 1.8V supply, etc.

It would be desirable to provide techniques for addressing these issues, e.g., to prevent breakdown of devices in an adjustable gain amplifier.

Figure 5:
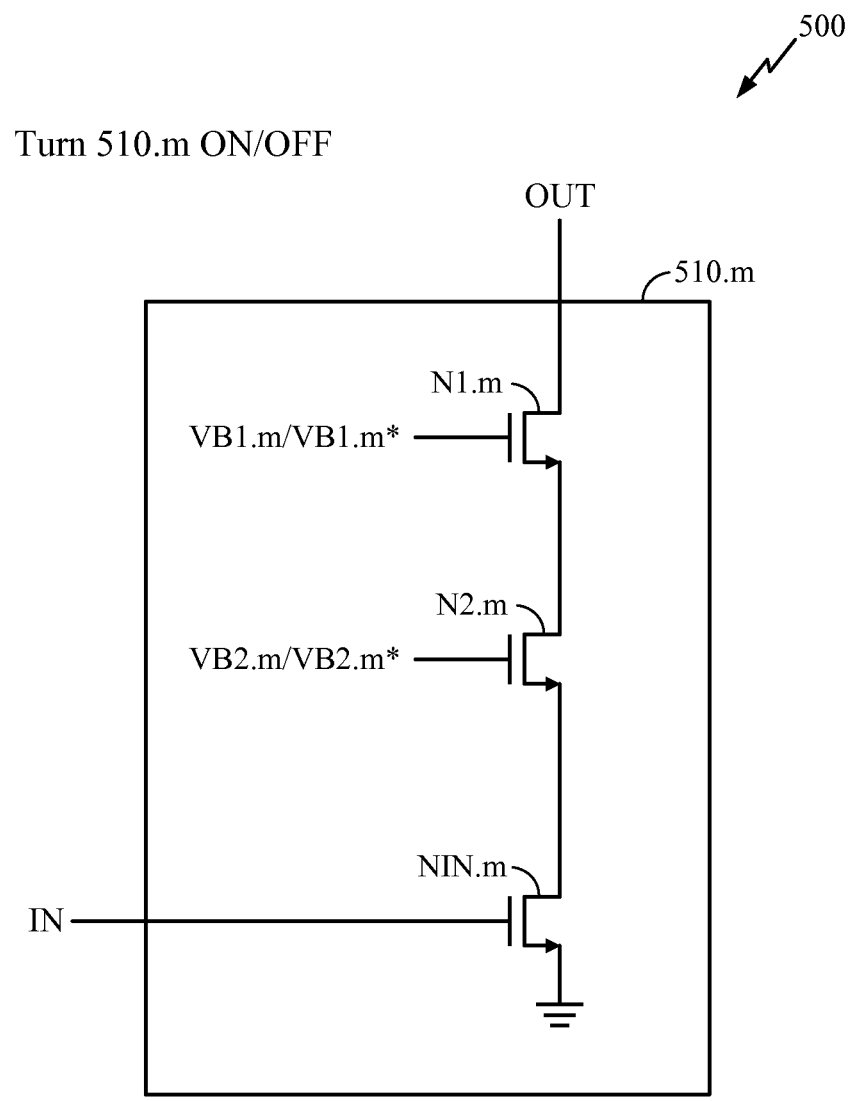
FIG. 5 illustrates an exemplary embodiment of a technique to configure a multi-cascode amplifier to turn the device on or off according to the present disclosure.

FIG. 5 illustrates an exemplary embodiment 500 of a technique to configure a multi-cascode amplifier 510.m to turn the device on or off according to the present disclosure. Note the multi-cascode amplifier 510.m may be coupled in parallel with other multi-cascode amplifiers (e.g., 510.1 through 510.m−1 and/or 510.m+1 through 510.M) adopting similar techniques to implement an adjustable gain composite amplifier. Note FIG. 5 is shown for illustrative purposes only, and is not meant to limit the scope of the present disclosure to any particular exemplary embodiment shown.

In FIG. 5, the gate voltage provided to the first cascode transistor N1.m is selectable between two values, depending on whether the amplifier 510.m is turned on or off. In particular, when 510.m is turned on, then the gate voltages of N1.m and N2.m are VB1.m and VB2.m, respectively. In an exemplary embodiment, VB1.m and VB2.m correspond to "turn-on" voltages sufficient to turn on the transistors N1.m and N2.m for multi-cascode circuit operation, as will be understood by one of ordinary skill in the art.

When 510.m is turned off, then the gate voltages of N1.m and N2.m are VB1.m* and VB2.m* V, respectively, wherein VB1.m* and VB2.m* correspond to first and second turn-off voltages for the first and second cascode transistors N1.m, N2.m, respectively. In an exemplary embodiment, the first turn-off voltage VB1.m* is chosen to reduce the drain-to-gate (Vdg) voltage across N1.m. In particular, VB1.m* and VB2.m* may be "optimal" turn-off voltages specifically chosen to simultaneously minimize the voltage drops, e.g., drain-to-gate (Vdg) and drain-to-source (Vds) voltages, across the terminals of the first cascode transistor N1.m and the second cascode transistor N2.m.

Illustrative turn-off voltages for the circuitry in 510.m according to the present disclosure are described hereinbelow with reference to FIG. 6. It will be appreciated that the illustrative voltage levels are provided by way of example only, and are not meant to limit the scope of the present disclosure to any particular voltages shown.

Figure 6:
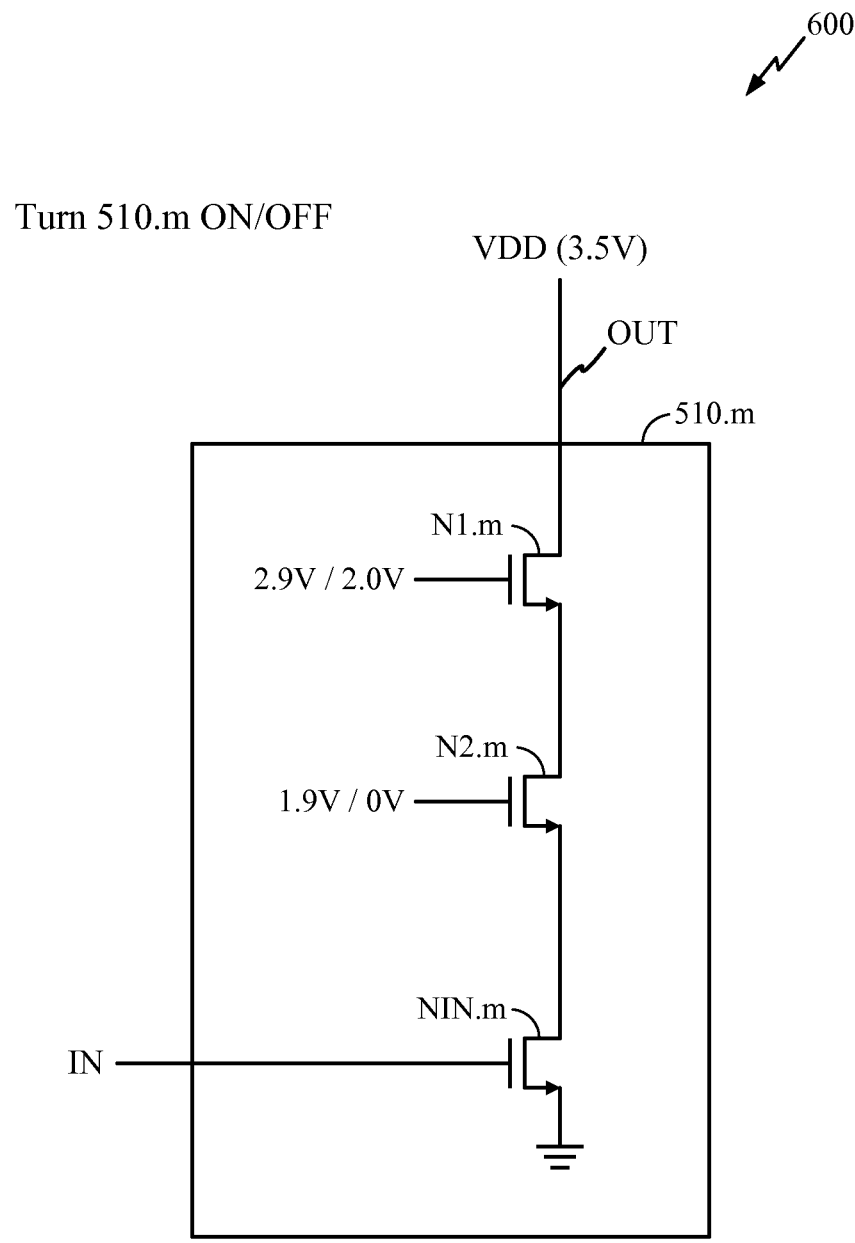
FIG. 6 illustrates examples of turn-off voltages for the circuitry in FIG. 5.

In FIG. 6, OUT is coupled to an exemplary VDD of 3.5 V. The gate of N1.m is coupled to VB1.m/VB1.m*=2.9 V/2.0 V, wherein the first voltage 2.9 V is an exemplary turn-on voltage for N1.m, and the second voltage 2.0 V is an exemplary turn-off voltage. The gate of N2.m is coupled to VB2.m/VB2.m*V=1.9 V/0 V, wherein the first voltage 1.9 V is an exemplary turn-on voltage for N2.m, and the second voltage 0 V is an exemplary turn-off voltage. Note by setting VB1.m* to 2V, when 510.m is turned off, then the drain-to-gate voltage (Vdg) of N1.m is 1.5 V, as opposed to 3.5 V if N1.m were grounded (e.g., as according to the implementation shown in FIG. 4). Furthermore, the source voltage of N1.m will also be 2 V, as the gate-to-source voltage (Vgs) of N1.m will be maintained at 0V due to no current flow through N2.m (as the gate voltage of transistor N2.m is grounded). Thus the drain-to-source voltage (Vds) of N1.m is also 1.5 V. It will be appreciated in light of these exemplary voltage settings that the terminal-to-terminal voltage drops across transistors N1.m and N2.m are limited to no more than 2 V, which is significantly lower than the VDD of 3.5 V.

In light of the present disclosure, one of ordinary skill in the art will appreciate that the turn-off voltage for the first cascode transistor N1.m may be pre-selected from an optimal turn-off voltage range. In particular, the optimal turn-off range includes any voltage applied to N1.m that would cause all terminal-to-terminal voltage drops across any of the cascode transistors to be less than the maximum voltage drop such transistor can support, and preferably less than such maximum voltage drop by a substantial margin.

Note in the exemplary embodiment 500 of FIG. 5 wherein the multi-cascode amplifier 510.$m$ includes two cascode transistors N1.$m$ and N2.$m$, the turn-off voltage VB2.$m$* for the second cascode transistor N2.$m$ may be ground, i.e., 0 V, while the first turn-off voltage VB1.$m$* for the first cascode transistor N1.$m$ may be substantially above ground, e.g., at least half the level of VDD coupled to the drain of N1.$m$, as illustrated in FIG. 6. Further note that, while two cascode transistors (N1.$m$ and N2.$m$) are shown in the exemplary embodiment 500 of FIG. 5, it will be appreciated that the techniques disclosed herein may readily be applied to multi-cascode configurations employing more than two cascode transistors. In such alternative exemplary embodiments, the gate of the cascode transistor closest to the input transistor NIN.m, also denoted herein as the "second cascode transistor" or the "lowermost cascode transistor," may be grounded, thus ensuring no DC current flow through any of the cascode transistors. In an exemplary embodiment, the gate voltages of the other cascode transistors may be made successively higher in voltage, with the gate of the cascode transistor closest to OUT, also denoted herein as the "first cascode transistor," having the highest gate voltage of all cascode transistors.

Figure 5A:
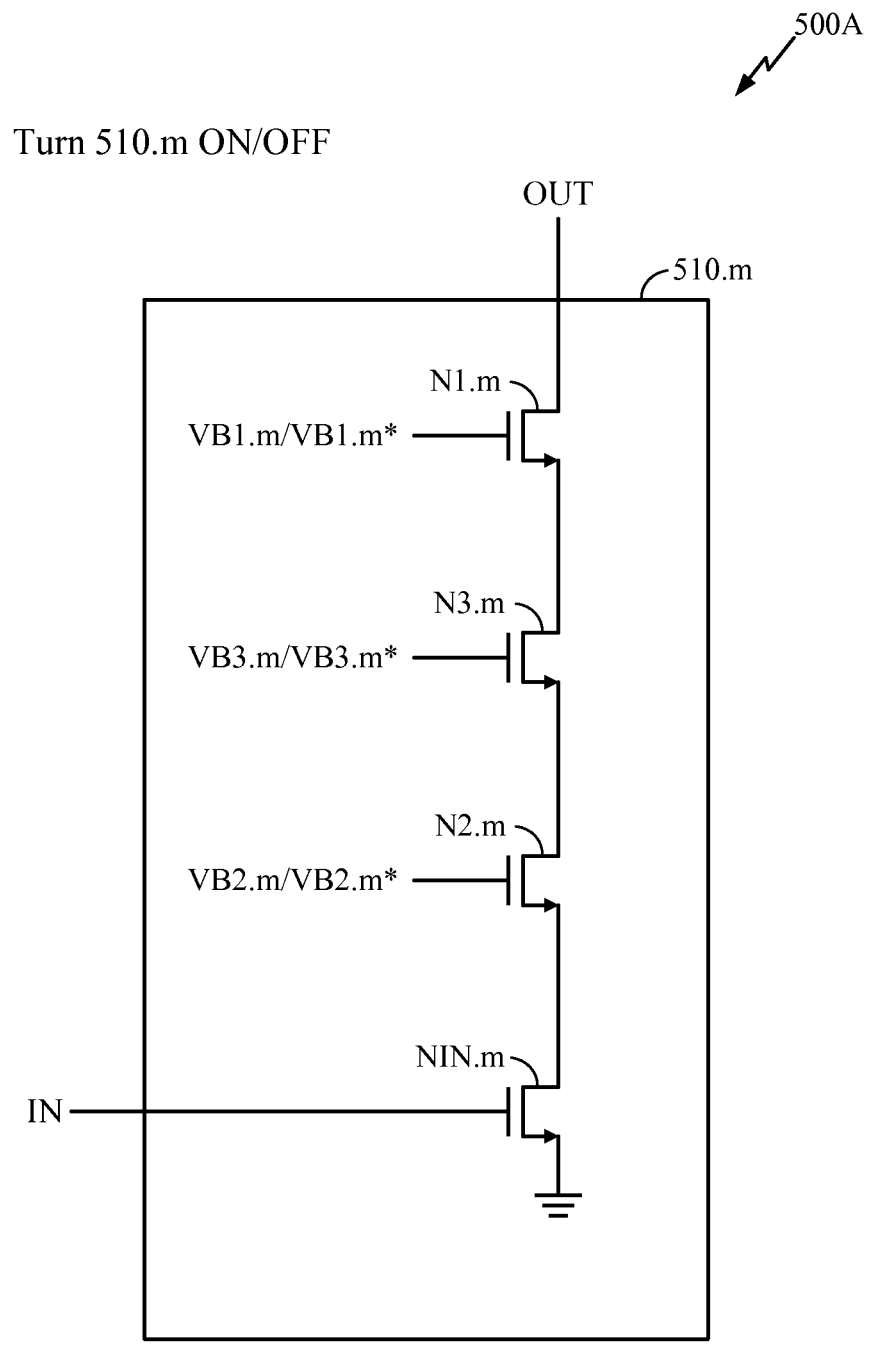
FIG. 5A illustrates a three-cascode exemplary embodiment according to the present disclosure.

For example, in a three-cascode exemplary embodiment 500A shown in FIG. 5A, a first cascode transistor N1.$m$ may have a drain directly coupled to OUT, a third cascode transistor N3.$m$ may have a drain coupled to the source of the first cascode transistor, and a second or lowermost cascode transistor N2.$m$ may have a drain coupled to the source of the third cascode transistor N3.$m$, with the source of the second cascode transistor directly coupled to the drain of the input transistor, etc. In such an exemplary three-cascode embodiment, the gate voltage of the second cascode transistor may be grounded when turned off, with the gate voltage of the first cascode transistor set to, e.g., approximately ⅔ VDD, while the gate voltage for the third cascode transistor is set to approximately ⅓ VDD. Such alternative exemplary embodiments are contemplated to be within the scope of the present disclosure.

While certain exemplary embodiments are described wherein NMOS transistors are used, one of ordinary skill in the art will appreciate that PMOS and/or other types of transistors may also be used to design amplifiers. In such cases, it will be appreciated that the techniques of the present disclosure may readily be modified to accommodate such alternative types of transistors, e.g., the reverse biasing polarities of PMOS versus NMOS transistors, etc. Such alternative exemplary embodiments are contemplated to be within the scope of the present disclosure.

Figure 7:
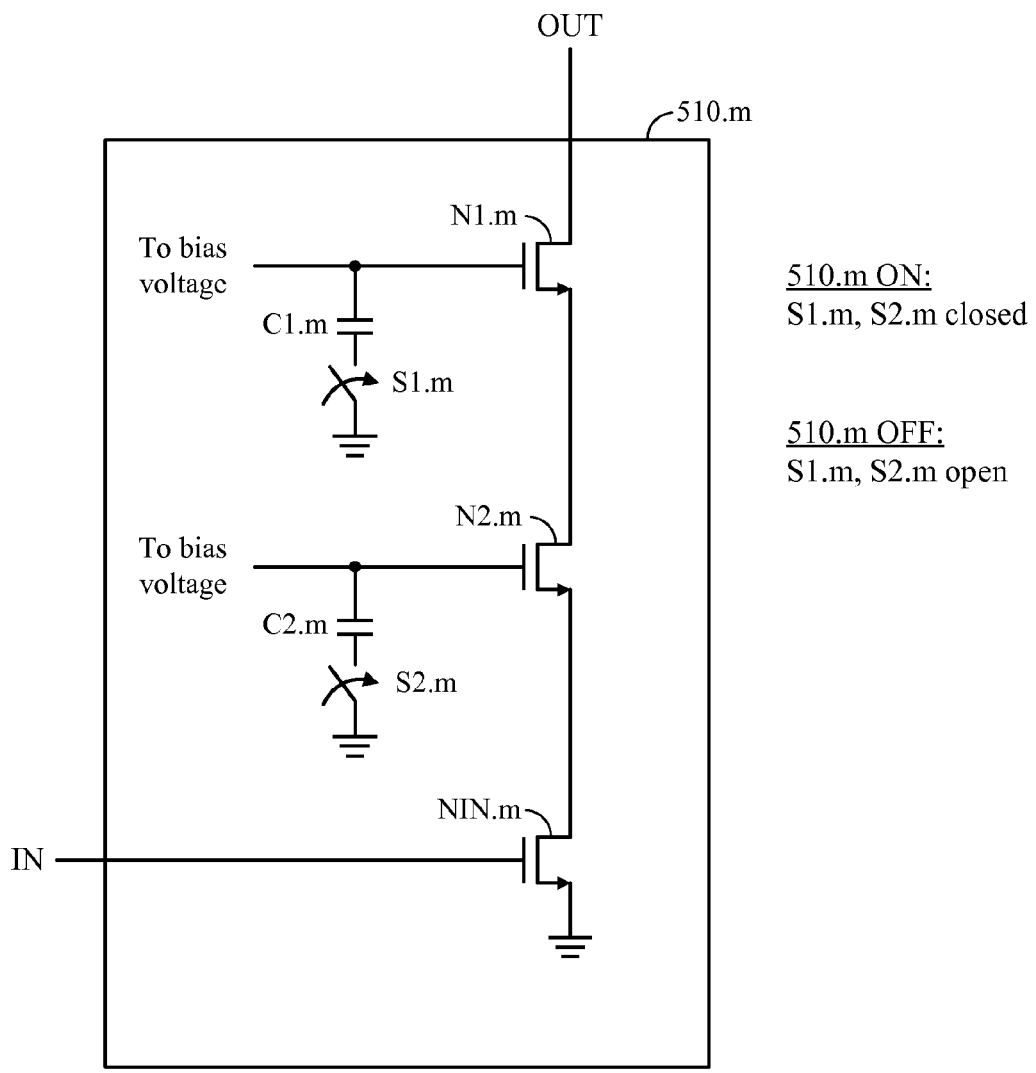
FIG. 7 illustrates an alternative exemplary embodiment of the present disclosure, wherein AC coupling capacitors $C1.m$, $C2.m$ are selectively coupled or decoupled from ground, depending on whether the amplifier $510.m$ is on or off.

FIG. 7 illustrates an alternative exemplary embodiment 700 of the present disclosure, wherein AC coupling capacitors C1.$m$, C2.$m$ are selectively coupled or decoupled from ground, depending on whether the amplifier 510.$m$ is on or off Note FIG. 7 is shown for illustrative purposes only, and is not meant to limit the scope of the present disclosure.

In FIG. 7, the gates of N1.$m$ and N2.$m$ are coupled to respective bias voltages. In an exemplary embodiment, the bias voltages for N1.$m$ and N2.$m$ may be set as described with reference to, e.g., FIGS. 5 and 6 (e.g., coupled to "optimal turn-off" bias voltages when the amplifier 510.$m$ is turned off), although the exemplary embodiment 700 of FIG. 7 need not be restricted to such bias voltage coupling. In FIG. 7, the gate of N1.$m$ is further coupled to a capacitor C1.$m$, which is selectively coupled to ground via a switch S1.$m$. The gate of N2.$m$ is coupled to a capacitor C2.$m$, which is selectively coupled to ground via a switch S2.$m$.

As indicated in FIG. 7, when 510.$m$ is turned on, then switches S1.$m$, S2.$m$ may both be closed, such that capacitors C1.$m$ and C2.$m$ respectively couple N1.$m$ and N2.$m$ to AC ground. On the other hand, when 510.$m$ is turned off, then switches S1.$m$, S2.$m$ may both be opened. In this case, it will be appreciated that capacitors C1.$m$ and C2.$m$ will thus contribute no additional capacitance to the gate terminals of transistors N1.$m$ and N2.$m$ when they are turned off. These make the gates of the cascode devices "floating," such that the Vdg's of the cascode devices are reduced, thus further reducing the voltage stresses on the cascode transistors. While an exemplary embodiment has been described hereinabove with reference to two cascode transistors N1.$m$, N2.$m$, it will be appreciated that the switchable AC coupling capacitors described herein may readily be incorporated in other multi-cascode configurations, e.g., incorporating three or even more cascode transistors. Such alternative exemplary embodiments are contemplated to be within the scope of the present disclosure.

Figure 8:
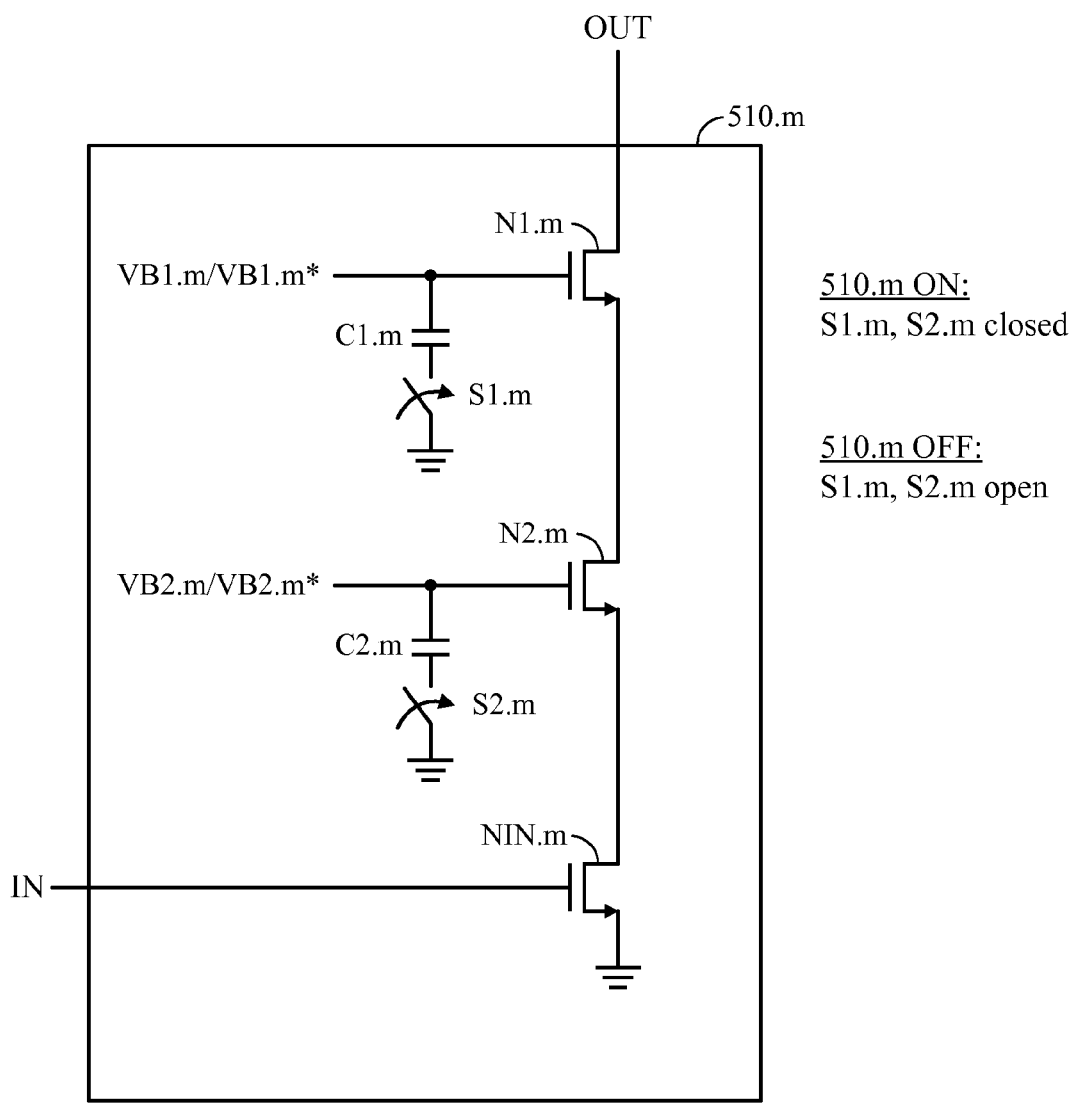
FIG. 8 illustrates an exemplary embodiment of a two-cascode amplifier according to the present disclosure, wherein the turn-off voltage biasing and switchable capacitor techniques of the present disclosure are combined.

FIG. 8 illustrates an exemplary embodiment 800 of a two-cascode amplifier 510.$m$ according to the present disclosure, wherein the turn-off voltage biasing and switchable capacitor techniques of the present disclosure are combined. Note FIG. 8 is shown for illustrative purposes only, and is not meant to limit the scope of the present disclosure to any particular exemplary embodiment, e.g., to embodiments wherein the turn-off voltage biasing and switchable capacitors are necessarily concurrently implemented. In FIG. 8, the gate voltages of N1.$m$ and N2.$m$ are coupled to bias voltages VB1.$m$ and VB2.$m$ when 510.$m$ is turned on, and to turn-off bias voltages VB1.$m$* and VB2.$m$* when 510.$m$ is turned off.

Figure 9:
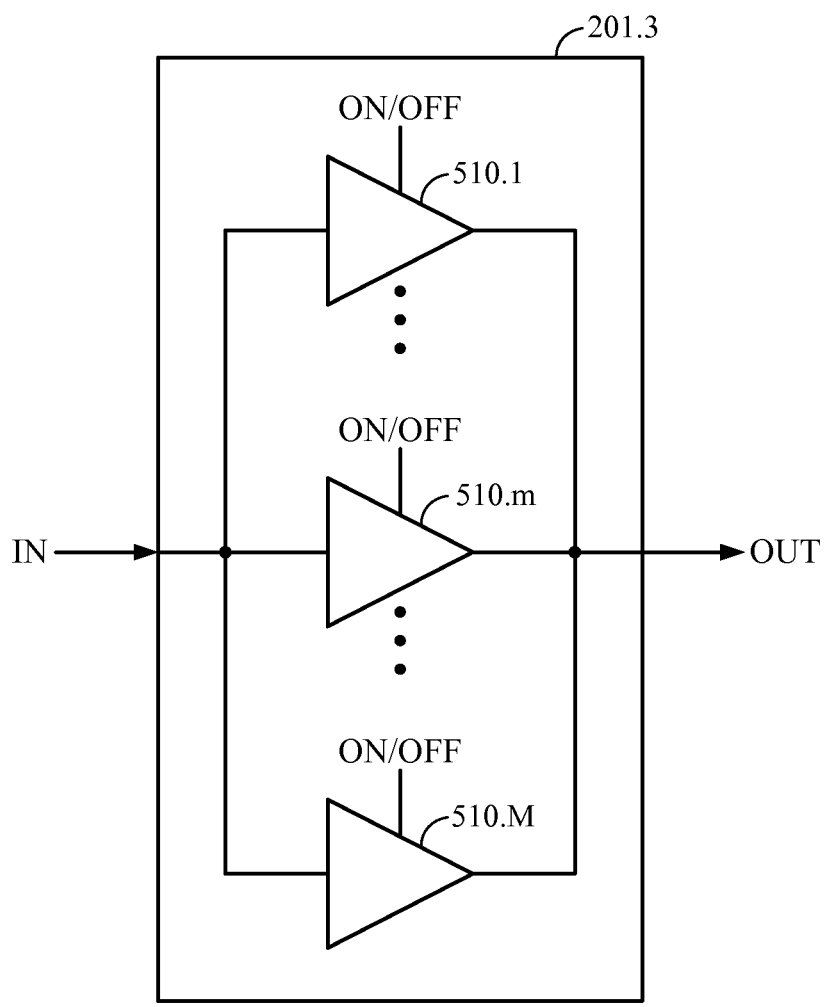
FIG. 9 illustrates an exemplary embodiment of an adjustable gain amplifier, wherein a plurality of amplifiers is coupled in parallel.

FIG. 9 illustrates an exemplary embodiment 201.3 of an adjustable gain amplifier 201, wherein a plurality of amplifiers 510.1 through 510.M is coupled in parallel. It will be appreciated in light of the present disclosure that any or all of the amplifiers 510.1 through 510.M may implement any of the techniques disclosed herein, e.g., with reference to FIG. 5, 7, or 8, etc.

Figure 10:
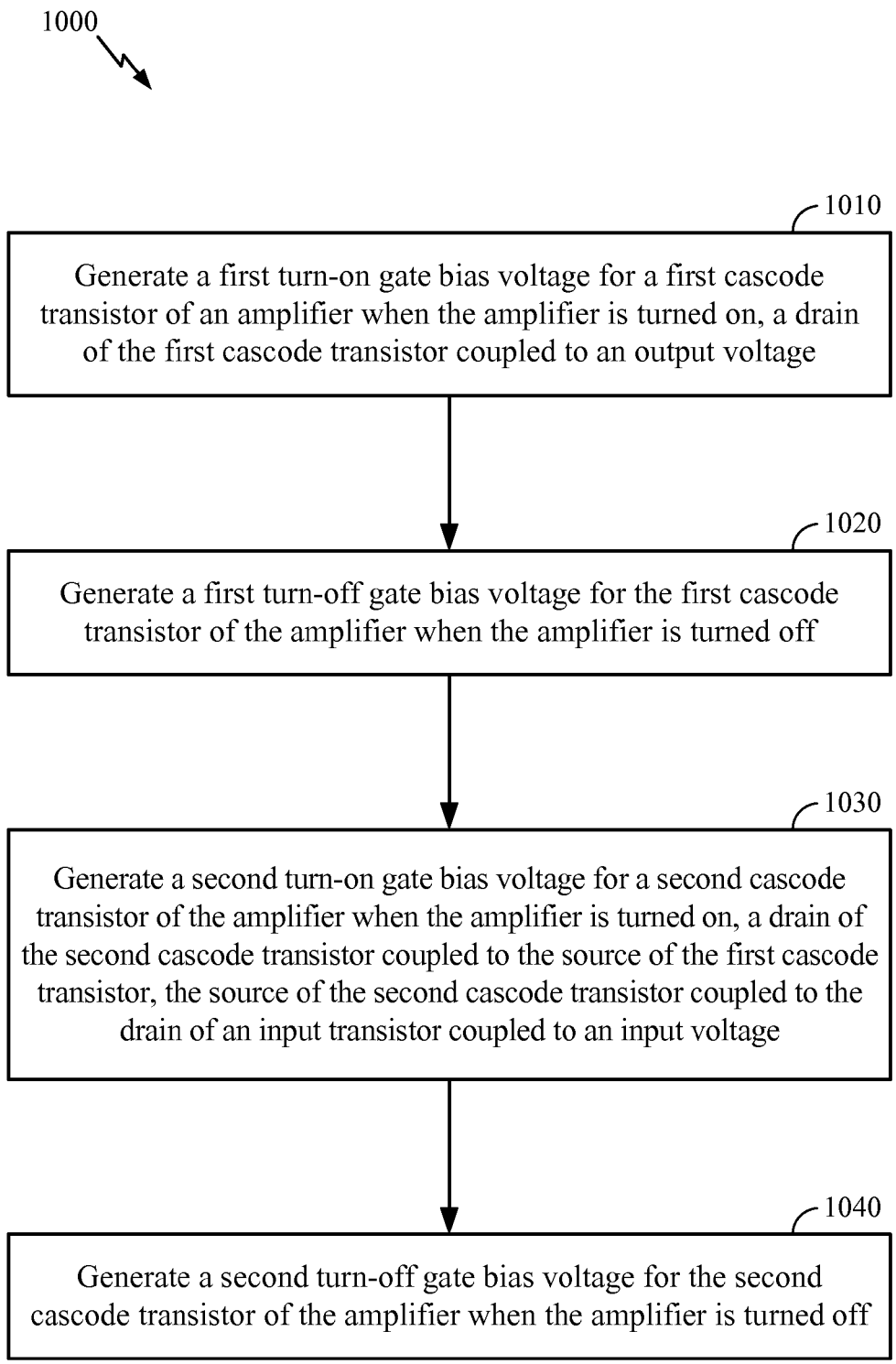
FIG. 10 illustrates an exemplary embodiment of a method according to the present disclosure.

FIG. 10 illustrates an exemplary embodiment 1000 of a method according to the present disclosure. Note FIG. 10 is shown for illustrative purposes only, and is not meant to limit the scope of the present disclosure.

In FIG. 10, at block 1010, a first turn-on gate bias voltage is generated for a first cascode transistor of an amplifier when the amplifier is turned on, a drain of the first cascode transistor coupled to an output voltage.

At block 1020, a first turn-off gate bias voltage is generated for the first cascode transistor of the amplifier when the amplifier is turned off At block 1030, a second turn-on gate bias voltage is generated for a second cascode transistor of the amplifier when the amplifier is turned on. A drain of the second cascode transistor is coupled to the source of the first cascode transistor, and the source of the second cascode transistor is coupled to the drain of an input transistor coupled to an input voltage.

At block 1040, a second turn-off gate bias voltage is generated for the second cascode transistor of the amplifier when the amplifier is turned off In an exemplary embodiment of the method 1000, the first turn-off gate bias voltage is set to a first turn-off voltage to minimize the drain-to-gate voltage of the first cascode transistor when the amplifier is turned off, and the second turn-off gate bias voltage is ground.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present. Furthermore, when an element is referred to as being "electrically coupled" to another element, it denotes that a path of low resistance is present between such elements, while when an element is referred to as being simply "coupled" to another element, there may or may not be a path of low resistance between such elements.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill in the art would further appreciate that the various illustrative logical blocks, modules, circuits, and algorithm steps described in connection with the exemplary aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary aspects of the invention.

The various illustrative logical blocks, modules, and circuits described in connection with the exemplary aspects disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the exemplary aspects disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-Ray disc where disks usually reproduce data magnetically, while discs reproduce data optically with lasers. Combinations of the above should also be included within the scope of computer-readable media.

The previous description of the disclosed exemplary aspects is provided to enable any person skilled in the art to make or use the invention. Various modifications to these exemplary aspects will be readily apparent to those skilled in the art, and the generic principles defined herein may be applied to other exemplary aspects without departing from the spirit or scope of the invention. Thus, the present disclosure is not intended to be limited to the exemplary aspects shown herein but is to be accorded the widest scope consistent with the principles and novel features disclosed herein.

The invention claimed is:

1. An apparatus comprising:
   at least two amplifiers coupled in parallel, each amplifier comprising:
      a first cascode transistor coupled to a first configurable gate bias voltage;
      a second cascode transistor coupled to a second configurable gate bias voltage; and
      an input transistor coupled to an input voltage;
   wherein the first configurable gate voltage is set to a first turn-off voltage when such amplifier is turned off and when at least one other of the at least two amplifiers is turned on, the first turn-off voltage selected to reduce a drain-to-gate voltage of the first cascode transistor relative to setting the gate voltage of the first cascode transistor to ground;
   wherein, when one of the at least two amplifiers is turned off, the second configurable gate voltage is set to ground.

2. The apparatus of claim 1, wherein a subset of the at least two amplifiers is configurable to be selectively turned on or off to adjust the composite gain of the at least two amplifiers.

3. An apparatus comprising:
at least two amplifiers coupled in parallel, each amplifier comprising:
a first cascode transistor coupled to a first configurable gate bias voltage;
a second cascode transistor coupled to a second configurable gate bias voltage; and
an input transistor coupled to an input voltage;
wherein the first configurable gate voltage is set to a first turn-off voltage when such amplifier is turned off and when at least one other of the at least two amplifiers is turned on, the first turn-off voltage selected to reduce a drain-to-gate voltage of the first cascode transistor relative to setting the gate voltage of the first cascode transistor to ground;
wherein the first turn-off voltage comprises a voltage such that the drain-to-source and drain-to-gate voltages of the first and second cascode transistors are less than a predetermined breakdown voltage of each device.

4. An apparatus comprising:
at least two amplifiers coupled in parallel, each amplifier comprising:
a first cascode transistor coupled to a first configurable gate bias voltage;
a second cascode transistor coupled to a second configurable gate bias voltage; and
an input transistor coupled to an input voltage;
wherein the first configurable gate voltage is set to a first turn-off voltage when such amplifier is turned off and when at least one other of the at least two amplifiers is turned on, the first turn-off voltage selected to reduce a drain-to-gate voltage of the first cascode transistor relative to setting the gate voltage of the first cascode transistor to ground;
the drain of the first cascode transistor being coupled to a DC supply voltage, wherein the first turn-off voltage is greater than half the DC supply voltage.

5. An apparatus comprising:
at least two amplifiers coupled in parallel, each amplifier comprising:
a first cascode transistor coupled to a first configurable gate bias voltage;
a second cascode transistor coupled to a second configurable gate bias voltage; and
an input transistor coupled to an input voltage;
wherein the first configurable gate voltage is set to a first turn-off voltage when such amplifier is turned off and when at least one other of the at least two amplifiers is turned on, the first turn-off voltage selected to reduce a drain-to-gate voltage of the first cascode transistor relative to setting the gate voltage of the first cascode transistor to ground;
each of the at least two amplifiers further comprising:
a third cascode transistor coupled to a third configurable gate bias voltage, a source of the third cascode transistor coupled to a source of the first cascode transistor, the drain of the second transistor coupled to a source of the third cascode transistor;
wherein, when the first configurable gate voltage is set to the first turn-off voltage, the third configurable gate bias voltage is set to a third turn-off voltage; and
wherein the first and third turn-off voltages are chosen to minimize the drain-to-gate voltages of the first and third cascode transistors when the amplifier is turned off.

6. The apparatus of claim 5, wherein:
the drain of the first cascode transistor is coupled to a source voltage;
the third turn-off voltage is higher than ground; and
the first turn-off voltage is between the source voltage and the third turn-off voltage.

7. An apparatus comprising:
an amplifier comprising:
a first cascode transistor coupled to a first configurable gate bias voltage;
a second cascode transistor coupled to a second configurable gate bias voltage; and
an input transistor coupled to an input voltage;
wherein the first configurable gate voltage is set to a first turn-off voltage when the amplifier is turned off, the first turn-off voltage selected to reduce a drain-to-gate voltage of the first cascode transistor relative to setting the gate voltage of the first cascode transistor to ground;
wherein:
the gate of the first cascode transistor of each of the at least two amplifiers is further coupled to an AC ground via a first capacitor and a first switch, the first switch configured to decouple the first capacitor from AC ground when the amplifier is turned off.

8. The apparatus of claim 7, wherein:
the gate of the second cascode transistor of the amplifier is further coupled to an AC ground via a second capacitor and a second switch, the second switch configured to decouple the second capacitor from AC ground when the amplifier is turned off.

9. The apparatus of claim 8, the amplifier further comprising a third cascode transistor coupled to a third configurable gate bias voltage, a drain of the third cascode transistor coupled to a source of the first cascode transistor, the drain of the second transistor coupled to a source of the third cascode transistor, wherein the gate of the third cascode transistor is further coupled to an AC ground via a third capacitor and a third switch, the third switch configured to decouple the third capacitor from AC ground when the amplifier is turned off.

10. The apparatus of claim 9, the output voltage coupled to a DC supply voltage.

11. An apparatus comprising:
at least two amplifiers coupled in parallel, each amplifier comprising:
an input transistor;
a first cascode transistor;
a second cascode transistor; and
means for biasing the first cascode transistor of an amplifier with a first turn-off voltage when such amplifier is turned off and when at least one other of the at least two amplifiers is turned on;
the apparatus further comprising means for biasing the second cascode transistor with a ground voltage when the amplifier is turned off.

12. An apparatus comprising:
at least two amplifiers coupled in parallel, each amplifier comprising:
an input transistor;
a first cascode transistor;
a second cascode transistor; and
means for biasing the first cascode transistor of an amplifier with a first turn-off voltage when such amplifier is turned off and when at least one other of the at least two amplifiers is turned on, the first turn-off voltage selected to reduce a drain-to-gate voltage of the first cascode transistor relative to setting the gate voltage of the first cascode transistor to ground; the apparatus further comprising:
a third cascode transistor comprising a drain coupled to a source of the first cascode transistor and a source coupled to the drain of the second cascode transistor;
means for biasing the third cascode transistor with a third turn-off voltage when the amplifier is turned off.

13. An apparatus comprising:
an amplifier comprising:
an input transistor;
a first cascode transistor;
a second cascode transistor;
means for biasing the first cascode transistor of an amplifier with a first turn-off voltage when the amplifier is turned off;
a third cascode transistor comprising a drain coupled to a source of the first cascode transistor and a source coupled to the drain of the second cascode transistor;
means for biasing the third cascode transistor with a third turn-off voltage when the amplifier is turned off
the apparatus further comprising:
means for selectively decoupling the gates of each of the first, second, and third cascode transistors from an AC ground when the amplifier is turned off.

14. The apparatus of claim 11, the drain of the first cascode transistor being coupled to a DC supply voltage, wherein the first turn-off voltage is greater than half the DC supply voltage.

15. A method comprising:
generating a first turn-on gate bias voltage for a first cascode transistor of an amplifier when the amplifier is turned on, a drain of the first cascode transistor coupled to an output voltage;
generating a first turn-off gate bias voltage for the first cascode transistor of the amplifier when the amplifier is turned off;
generating a second turn-on gate bias voltage for a second cascode transistor of the amplifier when the amplifier is turned on, a drain of the second cascode transistor coupled to the source of the first cascode transistor, the source of the second cascode transistor coupled to the drain of an input transistor coupled to an input voltage;
generating a second turn-off gate bias voltage for the second cascode transistor of the amplifier when the amplifier is turned off;
wherein the first turn-off gate bias voltage is set to a first voltage to minimize a drain-to-gate voltage of the first cascode transistor when the amplifier is turned off, and wherein the second turn-off gate bias voltage is ground;
the method further comprising:
selectively decoupling the gates of each of the first and second cascode transistors from an AC ground when the corresponding amplifier is turned off.

16. A method comprising:
generating a first turn-on gate bias voltage for a first cascode transistor of an amplifier when the amplifier is turned on, a drain of the first cascode transistor coupled to an output voltage;
generating a first turn-off gate bias voltage for the first cascode transistor of the amplifier when the amplifier is turned off;
generating a second turn-on gate bias voltage for a second cascode transistor of the amplifier when the amplifier is turned on, a drain of the second cascode transistor coupled to the source of the first cascode transistor, the source of the second cascode transistor coupled to the drain of an input transistor coupled to an input voltage;
generating a second turn-off gate bias voltage for the second cascode transistor of the amplifier when the amplifier is turned off;
wherein the first turn-off gate bias voltage is set to a first voltage to minimize a drain-to-gate voltage of the first cascode transistor when the amplifier is turned off, and wherein the second turn-off gate bias voltage is ground;
the method further comprising:
generating a third turn-on gate bias voltage for a third cascode transistor of the amplifier when the amplifier is turned on, a drain of the third cascode transistor coupled to the source of the first cascode transistor, the source of the third cascode transistor coupled to the drain of the second cascode transistor; and
generating a third turn-off gate bias voltage for the third cascode transistor of the amplifier when the amplifier is turned off, the third turn-off gate bias voltage corresponding to a voltage between ground and the first turn-off gate bias voltage.

17. The method of claim 16, further comprising:
selectively decoupling the gate of the third cascode transistor from an AC ground when the corresponding amplifier is turned off.

18. A method comprising:
generating a first turn-on gate bias voltage for a first cascode transistor of an amplifier when the amplifier is turned on, a drain of the first cascode transistor coupled to an output voltage;
generating a first turn-off gate bias voltage for the first cascode transistor of the amplifier when the amplifier is turned off;
generating a second turn-on gate bias voltage for a second cascode transistor of the amplifier when the amplifier is turned on, a drain of the second cascode transistor coupled to the source of the first cascode transistor, the source of the second cascode transistor coupled to the drain of an input transistor coupled to an input voltage;
generating a second turn-off gate bias voltage for the second cascode transistor of the amplifier when the amplifier is turned off;
wherein the first turn-off gate bias voltage is set to a first voltage to minimize a drain-to-gate voltage of the first cascode transistor when the amplifier is turned off, and wherein the second turn-off gate bias voltage is ground;
the method further comprising:
selecting the gain of a composite amplifier by turning on or off a subset of a plurality of amplifiers, each amplifier comprising a first cascode transistor, a second cascode transistor, and an input transistor.

19. A method comprising:
amplifying a signal using at least two amplifiers coupled in parallel, each amplifier comprising a first cascode transistor coupled to a first configurable gate bias voltage, a second cascode transistor coupled to a second configurable gate bias voltage, and an input transistor coupled to an input voltage;
turning off one of said at least two amplifiers by setting the first configurable gate bias voltage to a first turn-off voltage to reduce a drain-to-gate voltage of the first cascode transistor relative to setting the gate voltage of the first cascode transistor to ground, while turning on at least one other of the at least two amplifiers, the turning off comprising setting the second configurable gate voltage to ground.

* * * * *